United States Patent [19]

Shirai et al.

[11] Patent Number: 5,252,781
[45] Date of Patent: Oct. 12, 1993

[54] SUBSTRATE MEMBER HAVING ELECTRIC LINES AND APERTURED INSULATING FILM

[75] Inventors: Masaharu Shirai, Ohtsu; Kimihiro Yamanaka, Shiga, both of Japan

[73] Assignee: International Business Machines Corporation, Armonk, N.Y.

[21] Appl. No.: 859,750

[22] Filed: Mar. 30, 1992

[30] Foreign Application Priority Data

May 31, 1991 [JP] Japan .................. 3-156123

[51] Int. Cl.⁵ ............................................. H05K 1/00
[52] U.S. Cl. ................................. 174/261; 361/808
[58] Field of Search ............... 174/260, 261, 263; 361/398, 417, 418, 400, 403, 404; 228/179, 180.1; 439/83, 69

[56] References Cited

U.S. PATENT DOCUMENTS

| | | | |
|---|---|---|---|
| 3,610,811 | 10/1971 | O'Keefe ........................... | 174/261 X |
| 4,493,952 | 1/1985 | Kaleida .......................... | 361/398 X |
| 4,883,920 | 11/1989 | Tanabe et al. ................. | 228/180.1 X |
| 5,010,448 | 4/1991 | Kobari ........................... | 174/261 X |
| 5,025,348 | 6/1991 | Suzuki et al. ................. | 361/398 |
| 5,130,768 | 7/1992 | Wu et al. ....................... | 439/69 X |

FOREIGN PATENT DOCUMENTS

| | | |
|---|---|---|
| 0310357 | 9/1988 | European Pat. Off. . |
| 57-107042 | 12/1980 | Japan . |
| WO90/04912 | 5/1990 | PCT Int'l Appl. ............... 228/180.1 |

OTHER PUBLICATIONS

"Application of Precision Solder Volumes to Surface Pads", IBM Technical Disclosure, vol. 31, No. 11, Apr. 1990.

"Method of Joining IC Chip Lead", EPO Publication No. JP1135093, Abstract vol. 013386, Nov. 20, 1987, Suzuki Satoshi et al.

"Printed Wiring Board", EPO Publication No. JP1094696, Abstract vol. 013330, Jun. 10, 1987, Nakai Toru et al.

Primary Examiner—Leo P. Picard
Assistant Examiner—Trinidad Korka
Attorney, Agent, or Firm—Lawrence R. Fraley

[57] ABSTRACT

In a substrate member (e.g., circuit board), a plurality of openings (15) are formed in an insulating film (14) which covers electric lines (12) formed on a substrate 11, with pad constructing (contacting) portions (13) of selected ones of the electric lines being exposed. In one example, the pad constructing portion (that portion of the pad to which final connection is to occur, e.g., by solder to a semiconductor device), is set to a first dimension (e.g., length) having a dimension less than a corresponding dimension of the original length. The film openings are also set to another dimension having an allowance size larger than a corresponding dimension of the pad constructing portion. The opening is thus of sufficiently large size in comparison to the respective pad being exposed so as to assure effective tolerance compensation for film positioning deviations in at least two (e.g., X and Y) directions as might occur during production of the substrate member.

6 Claims, 4 Drawing Sheets

SUBSTRATE MEMBER HAVING ELECTRIC LINES AND APERTURED INSULATING FILM

TECHNICAL FIELD

The invention relates to substrate members (e.g., circuit boards) including electric lines as part thereof and to a method of manufacturing such a substrate member. More particularly, the invention relates to a substrate member and method of making same wherein pads formed in conjunction with said lines and having predetermined areas in a predetermined positional relation are utilized while permitting a relative positional deviation between such pads (also referred to as pad constructing portions) of the electric lines and respective openings within an insulating film also used as part of the substrate member, the film functioning to cover selected portions of the line(s).

DESCRIPTION

In a substrate member (e.g., printed circuit board) including electric lines, such electric (e.g., copper) lines are provided on a dielectric (e.g., fiberglass reinforced epoxy resin) substrate and an electrically insulating film may be provided on the substrate so as to cover the electric lines or portions thereof. To electrically connect the electric lines on the substrate to other circuits or components, openings may be formed in the insulating film in order to expose parts of the electric lines, such exposed line portions also being defined as "pads" (or pad constructing portions).

It is required that such pads be of specified area (large enough) in order to assure the reliability of the electrical connection. Particularly, in a small substrate such as a substrate having electric lines used to support (be coupled to) a semiconductor chip or the like (such exposed areas being extremely small), the exposed areas of the pad must be precisely defined. Moreover, in a flip-chip type of structure (wherein the pads on the substrate and the pads on the semiconductor chip typically used in such members are connected by a metal (e.g., solder) ball, not only are both of the paired pads electrically connected but also the semiconductor chip is physically positioned onto the substrate having such electric pads/lines, such that the area of the pad is also important in terms of providing sufficient strength for the final structure.

In the situation where a position of an opening formed in an insulating film is offset from an electric line pad constructing portion provided, e.g., at a front edge of an electric line, the resulting exposure area of the electric line pad may be too small, such that the reliabilities of any electrical connection and attaching strength may be severely diminished.

Because a process to form an electric line onto the substrate and to precisely orient the insulating film onto the substrate so as to precisely form an opening relative to each line/pad must be sequentially executed (e.g., the lines are formed on the dielectric substrate first, following which the film is positioned thereover), a possibility exists that the positional deviation between the line/pad constructing portion and the respective film opening as mentioned above may be extremely high.

Even if the positional deviation is of a degree such that only a part of the line/pad constructing portion is covered by the insulating film, the problem of the aforementioned poor reliabilities still exists. That is, even in the case where part of the pad constructing portion lies within the film opening, the portion of the insulative film over the electric line may also function as a connecting pad, together with the pad constructing portion. Therefore, the combined pad area fluctuates due to the above positional deviation.

FIGS. 10-13 are provided to better illustrate the above. In FIG. 10, for example, the underlying circuit line 1 terminates in a circular contacting portion (pad) 2 of a predetermined diameter smaller than the respective opening 4 in the dielectric film (3) located thereover. Should the opening be shifted slightly, as in FIG. 11, a relatively large substrate surface area under the opening remains exposed. This is further seen for a positional change as depicted in FIG. 12. To prevent the above, a relatively large, annular pad may be provided (FIG. 13) in combination with a smaller diameter film opening 4. Using such parameters, film positioning deviations (no greater than dimension A) are compensated for to assure that a suitable pad area will always remain exposed. This necessitates, however, the defined provision of large pad sites, further reducing the chance for high density site arrays highly desired in today's information handling systems (computer) environments to which the present invention is particularly suited.

To solve the foregoing and related problems, an improved method of making a substrate member has been developed. It is believed that such a method, and the substrate member resulting therefrom, will constitute a significant advancement in the art.

DISCLOSURE OF THE INVENTION

It is an object of the invention to provide a substrate member having electric lines in which even when a predetermined positional deviation of an opening formed in the member's insulating film relative to a pad constructing portion of the member's electric line(s) occurs, such deviation is acceptable and a pad of a predetermined area can be assured.

It is another object of the invention to provide a method of making a substrate member having electric lines wherein a plurality of pads are formed onto a substrate (e.g., at the end of electric lines), such that even when a positional deviation of the openings in the member's insulation film occurs, as mentioned above, the relative positioning relation between the pads is held relatively constant.

BEST MODE FOR CARRYING OUT THE INVENTION

For a better understanding of the present invention, together with other and further objects, advantages and capabilities thereof, reference is made to the following disclosure and appended claims in connection with the above-described drawings.

In the description provided below, like numerals will be provided to describe like elements.

Figure 1:
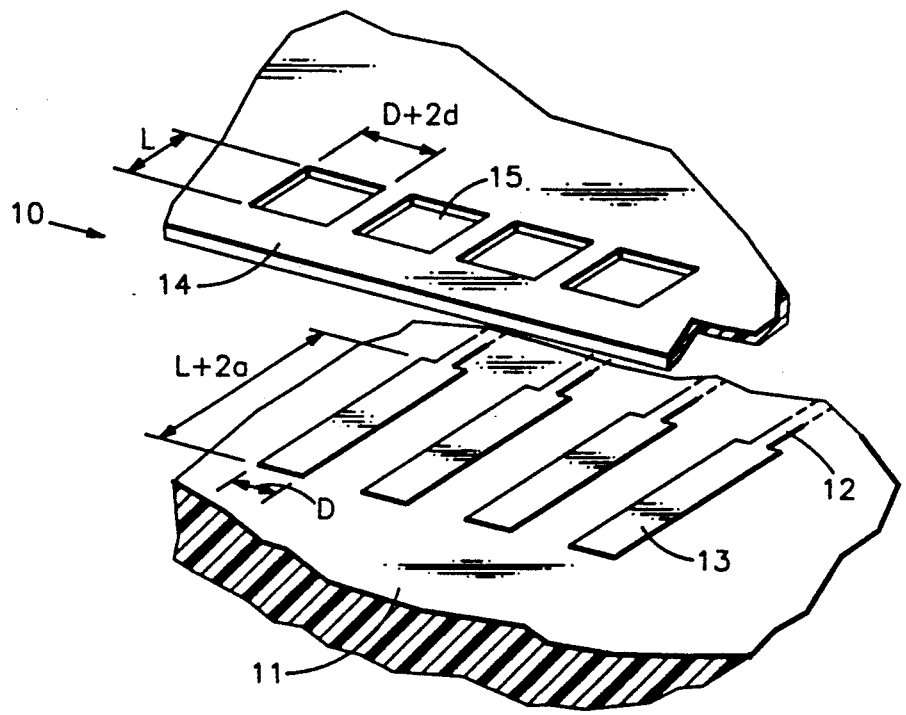
FIG. 1 is an exploded perspective view of a substrate member including electric lines according to an embodiment of the invention.

FIG. 1 shows a substrate member 10 having electric lines 12 according to one embodiment of the invention. A plurality (only five are illustrated in FIG. 1, but it is understood that several more may be used) of these electric lines are formed on a substrate 11 made of an insulating material (e.g., conventional epoxy resin dielectric material known in the art). Front edge portions of lines 12 are formed with pad constructing portions (pads) 13 whose widths (dimension D) are wider than those of the other portions of line 12.

Figure 4:
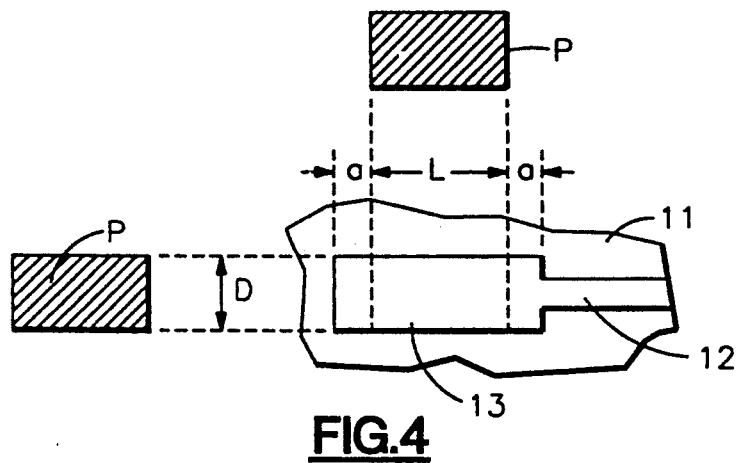
FIG. 4 is a representative diagram illustrating a size of an electric line according to the invention.

Further aspects of a representative pad constructing portion 13 will now be described with reference to FIG. 4.

P, as shown in the drawings, denotes a pad having a predetermined size to be formed at one end of the substrate's electric lines. This pad is schematically illustrated in FIG. 4 for ease of understanding. The dimension in the width direction of the pad constructing portion 13 shown adjacent representative pad P is the same as width D of the pad P. The dimension in the length direction of the pad constructing portion 13 is set to a value which is obtained by adding a specified allowance ("a" and "a", or $2a$) to a length (L) of the pad P. Length L also corresponds to the length of the opening (15) in film 14, described further below.

The electric line 12 as mentioned above can be formed on substrate 11 by a well-known method (e.g., photolithography, where a metal (e.g., copper) film is formed on the substrate and the metal film is then selectively etched using a mask having a predetermined pattern). Such methods are known in the circuit board art and further description is not believed necessary.

Returning to FIG. 1, an insulating film 14 which covers selected portions of the electric lines 12 is formed over the substrate 11 (and lines 12). A plurality of openings 15 corresponding to the pad constructing portions 13 are formed in the insulating film 14. Each opening 15 is formed in a predetermined size so as to expose a part of the pad constructing portion 13 when located on the substrate. Film 14 may be of any suitable dielectric material (e.g., polymer, such as polyimide) known in the art. Further definition is thus not believed necessary.

Figure 5:
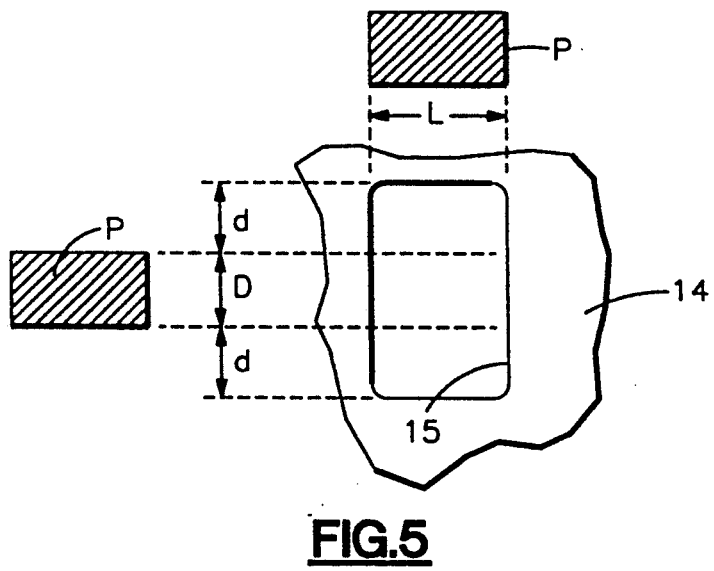
FIG. 5 is a representative diagram illustrating a size of opening of an insulating film according to the invention.

The size of the opening 15 provided in film 14 will now be described with reference to FIG. 5.

The opening 15 preferably has a substantially rectangular shape, if being aligned to a pad of similar configuration. Significantly, the size of the opening 15 in the same direction as the width direction of the pad constructing portion 13 is equal to a value which is obtained by adding an allowance ($2d$) to the width (D) of the pad P. Of further significance, the dimension of the opening 15 in the same direction as the length direction of the pad constructing portion 13 (FIG. 4) is the same as the length L of the pad P.

The opening 15 as mentioned above can be formed by a well-known method (e.g., where the insulating film 14 is deposited on the substrate using known techniques and is then etched using a mask having a predetermined pattern).

Figure 2:
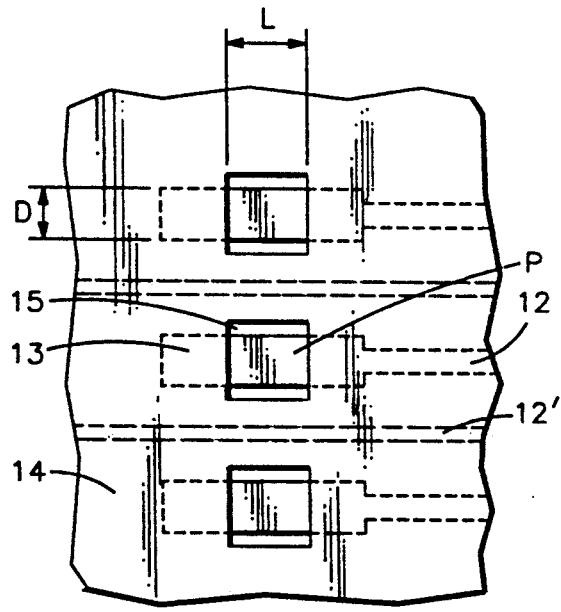
FIG. 2 is a plan view of the substrate member including electric lines according to an embodiment of the invention.

FIG. 2 shows a situation wherein the substrate member 10 formed with the aforedefined insulating film 14 is seen from an upper position.

As understood from the above, by imposing an opening(s) 15 of the dielectric insulating film 14 on the pad constructing portion(s) 13 of the electric line(s) 12, the pad(s) P having predetermined dimensions (length L and width D) is/are formed relative to each respective opening 15. That is, the film opening defines the exposed pad area thereunder having the dimensions stated.

As also mentioned above, the pad(s) P having length L and width D is/are formed by the width dimension D of the pad constructing portion(s) 13 and the length dimension L of the film opening(s) 15. Because the pad constructing portion(s) 13 of the length dimension $L+2a$ is exposed from the opening(s) 15 of the width dimension $D+2d$, the positioning of the opening(s) 15 to the pad constructing portion(s) 13 has an allowance of $2a$ in the length direction and an allowance of $2d$ in the width direction. Therefore, a positioning deviation of the opening(s) 15 to the pad constructing portion(s) 13 can be absorbed by the above allowances ($2a$, $2d$) in two different directions (X, Y directions) which cross perpendicularly. The result of this is that a pad(s) P of a predetermined size (namely, predetermined surface area) can be obtained.

FIG. 2 shows an example wherein another electric line 12' may exist between adjacent pads P. Significantly, the allowance $2d$ which is added to the size D in the width direction of the opening 15 is set such that the opening 15 does not expose any such adjacent electric lines. That is, only the portion of electric lines which are necessary to form the pads P are exposed from respective openings 15, so that the other portions of any electric lines, whether or not including pad portions as part thereof, are covered by insulating film 14. Thus, even when the allowance dimensions as mentioned above are given to the opening 15, a problem such as a short-circuit between electric lines will not occur. In other words, the overall width ($D+2d$) of each opening is set such that the opening will never expose part of an interim circuit line such as line 12' with film to substrate positional deviations expected to the extent described herein.

The above deviation compensation is thus particularly applicable to pad arrays of adjacent pads which may lie substantially parallel to each other (as in FIG. 1–3), and more particularly to such arrays wherein separate circuit lines (from those resulting in the pads in the arrays) may lie adjacent/between such pads and/or the circuit lines including same.

Figure 3:
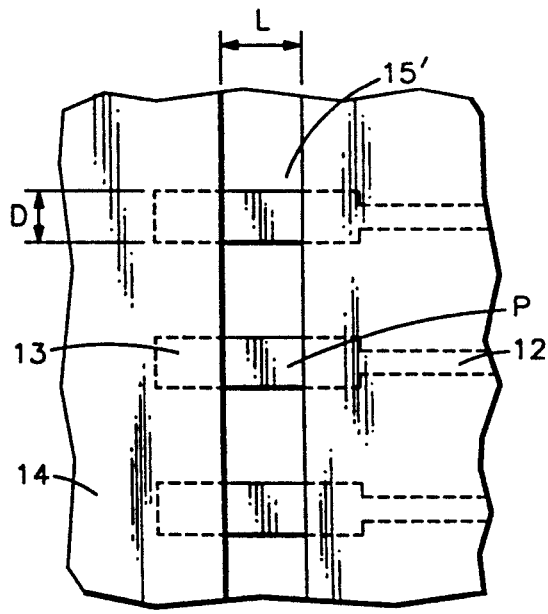
FIG. 3 is a plan view of a substrate including electric lines according to another embodiment of the invention.

FIG. 3 shows an example in which adjacent pads P are exposed by a singular, elongated opening 15', which is established in film 14 at dimensions different from those above for openings 15. The opening 15' in the example is an elongated slot which is preferably formed by consecutively forming a plurality of continuous openings 15, all of a common length (also L). It is seen that such an opening 15' will expose adjacent pads P (e.g., three) therebelow of a predetermined size, having an exposed length of dimension L (of the opening 15') and an exposed width of dimension D.

The foregoing example (using opening 15') can be used in the situation where a possibility of a short-circuit between the electric lines is minimal, as in the situation where a distance between the electric lines 12 is relatively large and the pad constructing portions 13 are arranged in parallel. Also, no interim lines (e.g., line 12') are used in this example.

In the example of FIG. 3, each of the pads P has a length L and width D formed by the width dimension D of the pad constructing portion 13 and the length dimension L of the respective opening 15' in film 14. The positioning of opening 15' to the respective pad constructing portions 13 thus provides a tolerance allowance of $2a$ in the length direction and an allowance not particularly limited in the width (D) direction, should film positioning deviations occur. Therefore, any such deviation by film 14 (and thus opening 15') to the pad constructing portions 13 can be absorbed by this allowance. Pads P of a desired, predetermined size (namely, predetermined surface area) can thus be obtained to assure that acceptable connections can be effected between the pad and associated electrical elements (e.g., a semiconductor chip), including particularly, wherein solder or the like material is to be used and located atop the pad's exposed constructing (contact) portion.

Accordingly, in a substrate having electric lines, where a plurality of pads are arranged along one direction, by providing the defined dimensional allowances to the pad's electric line side(s) and the respective opening side of the insulating film as mentioned above, the positioning deviations in these directions are permitted and pads of desired, predetermined area can be assured.

Figure 6:
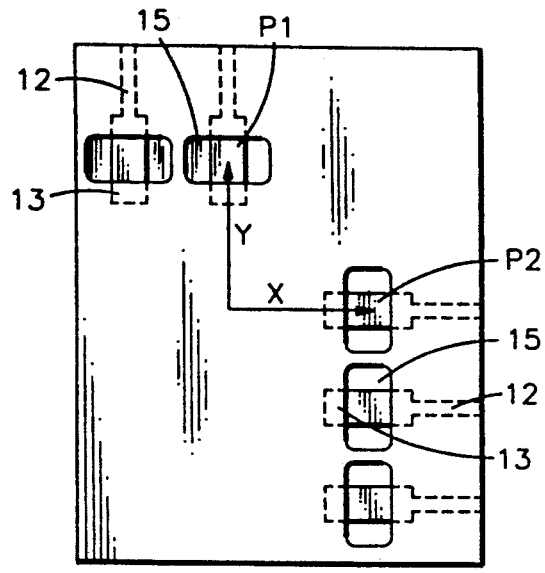
FIG. 6 is a representative diagram illustrating an arrangement of pads according to one embodiment of the invention.

Further, in substrate members having electric lines which, in many cases, contain pads arranged in arrays oriented in different (e.g., offset) directions, the invention taught herein is readily able to compensate for such offsets. Such compensation will be further defined hereinbelow with respect to FIGS. 6-9 (e.g., the pads are arranged in an offset orientation and not always directly adjacent, as shown in FIG. 6 (the pad arrays being perpendicular) and FIG. 8 (the pads are parallel, but staggered)). The pads in FIG. 8 are also angularly oriented relative to the illustrated directions of deviation (X, Y) and not perpendicular thereto, as in FIGS. 6 and 7.

In such offsetting arrays, even when dimensional allowances are provided relative to the electric line pattern and the patterns of openings of the insulating film as mentioned above, a positional deviation between the pads still occurs. Thus, there occurs a potential problem such that when the pads are connected to a semiconductor chip or the like (e.g., using pluralities of solder balls), the connection of such pads might possibly not be effectively obtained. As defined below, the invention overcomes such a problem and assures that effective pad area will result for such offset arrays.

As shown in FIG. 6, there is considered an example of a situation where one array of pads ($p_1$) are arranged (e.g., vertically in FIG. 6) and another array of pads ($p_2$) are arranged (e.g., horizontally in FIG. 6) in directions which cross perpendicularly). In this situation, relative offset amounts between the centers of the pads in these arrays are designated in the X and Y directions, respectively, X being a horizontal direction and Y the vertical direction.

Figure 7:
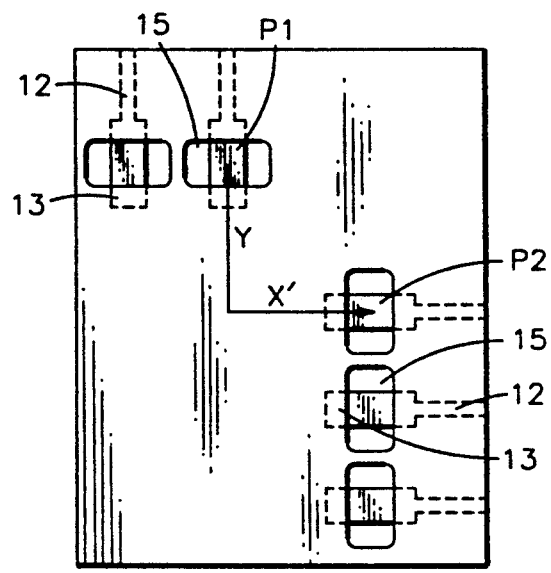
FIG. 7 is a representative diagram illustrating an arrangement of pads according to the embodiment of FIG. 6, with the invention's insulating film deviated in one direction (e.g., to the right).
Figure 8:
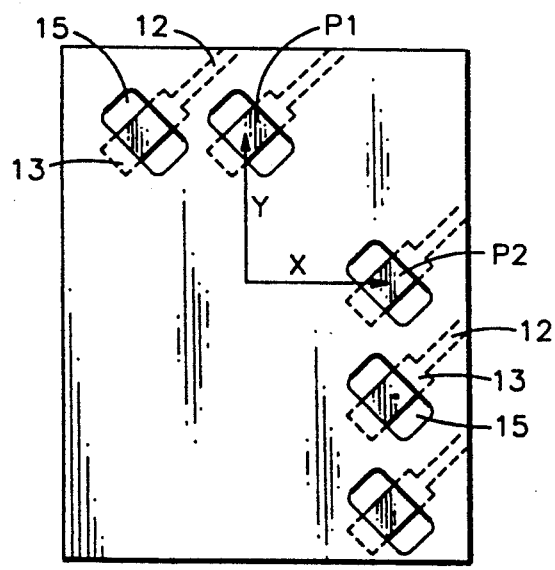
FIG. 8 is a representative diagram illustrating another arrangement of pads according to the invention.

In the above design, as shown in FIG. 7, in the situation where the position of the opening 15 of the insulating film 14 is deviated to the right, an area of each of the pads $p_1$ and $p_2$ is held to a predetermined size by the allowance dimensions of the pad constructing portion 13 and the opening 15 as described above. However, the offset amounts between the center of the pad $p_1$ and the center of the pad $p_2$ fluctuate (X', Y). That is, the amount X increases to X' and differs from the initial design value.

Figure 9:
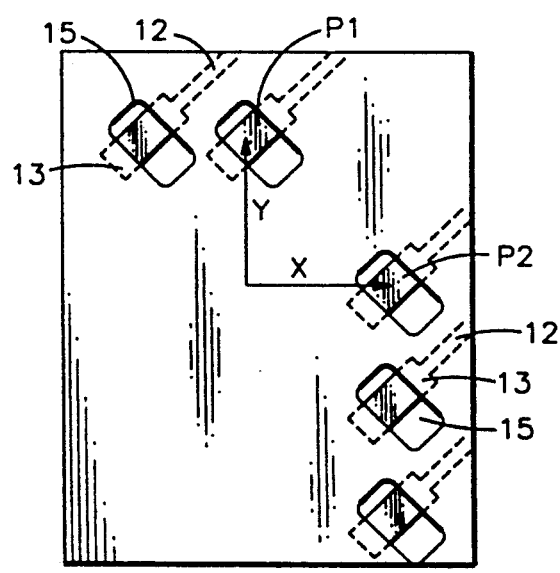
FIG. 9 is a diagram illustrating an arrangement of pads according to the embodiment of FIG. 8, wherein the invention's insulating film is deviated in one direction (e.g., to the lower right).
Figure 10:
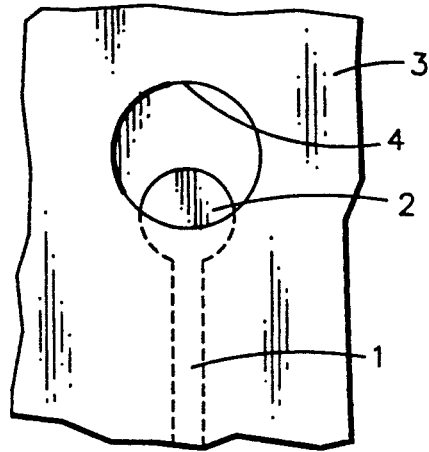
FIGS. 10–13 represent various diagrams of pad arrangements of various substrates having electric lines, and the problems associated therewith.
Figure 11:
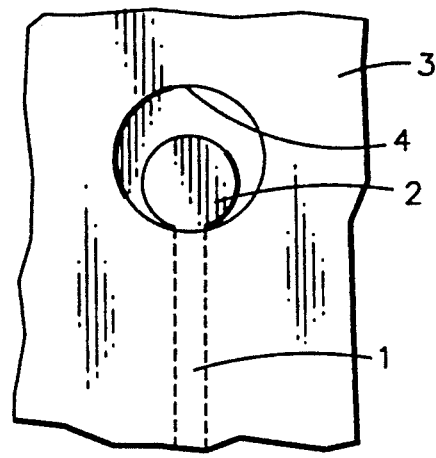
Figure 12:
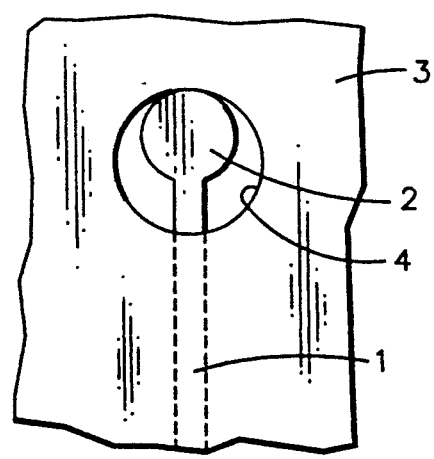
Figure 13:
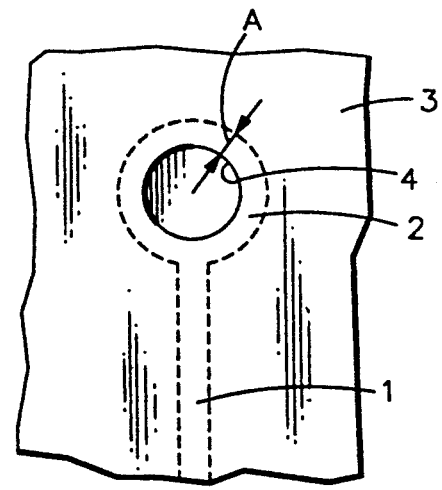

In order to eliminate the relative positional deviations among the pads as shown in FIGS. 8 and 9, the electric lines 12 and the openings 15 are formed under conditions defined herein.

That is, all of the pad constructing portions 13 of the electric lines are formed in parallel with each other. All of the openings 15 which are superimposed over the respective pad constructing portions 13 are also formed in parallel with each other. In such a design, each of the pads $p_1$ and $p_2$ also has a predetermined area and the relative offset amounts between the array of the pads $p_1$ and the array of the pads $p_2$ are also set (to X and Y).

In the design as mentioned above, as shown in FIG. 9, when the position of the opening 15 of the insulating film 14 is deviated to the right (horizontally) and slightly downward (vertically), an area of each of the pads $p_1$ and $p_2$ is thus assured to a predetermined size by the allowance dimensions of the pad constructing portion 13 and the opening 15 as described above.

Further, the offset amounts between the center of the pad $p_1$ and the center of the pad $p_2$ are held (to X, Y). This is because the pad constructing portions 13 are in parallel with each other and the openings 15 are in parallel with each other, the centers of the pads $p_1$ and $p_2$ are shifted by only the equal amount in the same direction due to the influence by the positional deviation.

Therefore, all of the pad constructing portions 13 of the electric lines are formed in parallel with each other and all of the openings 15 which are superimposed over the pad constructing portions so as to cross same are also formed in parallel with each other, so that the above operation and effect are obtained.

In the embodiment in FIGS. 8 (and 9), an example in which the pad constructing portions 13 are formed in the front edge portions of the electric lines 12 and thus as extensions thereof to form the pads P has been shown. It is also possible, according to the teachings herein, to enable the films openings to expose, in addition to the front edge portions of the electric lines 12, other portions of the substrate member's electric lines through the insulating film without requiring any additional modifications to the film. That is, the pads can also be formed from the electric lines themselves so long as the area which is required for effective connection can be assured. In this situation, since the electric line itself is extended from the pad portion to a thinner line, allowance is thus provided for the positional deviation of the desired opening. It is, therefore, sufficient to only give the foregoing allowance ($2d$) to the opening of the insulating film which is superimposed over such electric lines oriented in the pattern of arrays shown therein.

Although the shapes of the pad contacting portions of the electric lines and the openings of the insulating film are not particularly limited, rectangular shapes are desirable.

According to the invention, by making the direction in which there is an allowance of the pad constructing (contacting) portion different from the direction in which there is an allowance for the respective opening 15 aligned therewith, the positional deviation of the opening for such a pad constructing portion can be permitted in all of the directions of the XY plane. Specifically, providing additional width openings in the invention's films (D+2d) in the manner taught herein allows effective tolerance allowances for arrays of pads having a specified width dimension (e.g., D) and a specified length dimension (e.g., L+2a), provided the film opening also includes an established length approximately equal to that of the respective length (L) of each pad. Such tolerancing is possible, significantly, for electric line pads lying directly adjacent one another and substantially parallel (e.g., FIGS. 2 and 3) as well as arrays wherein the pads are orthogonal (FIG. 6) or parallel and staggered (FIG. 8). Regardless, film positioning deviations (which may occur during the various steps of producing the invention) are adequately compensated for to assure resulting exposed pad contacting portions of adequate total area for subsequent operations (e.g., solder ball deposition and connection with a semiconductor device).

What is claimed is:

1. A substrate member including electric lines, said substrate member comprising:
    a dielectric substrate;
    electric lines, formed on said substrate, selected ones of said electric lines having a contact pad located at one end thereof or forming a part thereof; and an insulating film covering said electric lines and including a plurality of openings therein, each of said openings exposing respective designated parts of said contact pads, sand contact pads having a first length dimension greater that the corresponding dimension of said openings within said insulating film and a second width dimension less than the corresponding dimension of said openings such that substantially the entire width and at least a portion of the length of each of said contact pads will remain exposed through respective ones of said openings, the total area of each of said exposed parts of said contact pads through said respective openings in said insulating film being defined by said second width dimension of said contact pad and said corresponding dimension of said opening in said film to said first length dimension of said pad, whereby said total area of each of said designated parts of said pads will be so exposed despite positional deviations between said film and said electric lines on said substrate during the manufacture of said substrate member, said dimension of said opening in said insulating film corresponding to said width dimension of said contact pad being such that said opening will never expose an adjacent one or more of said electric lines on said substrate.

2. The substrate member of claim 1 wherein said contact pads and said openings are of substantially rectangular configuration.

3. The substrate member of claim 2 wherein said contact pads are substantially parallel and lie in a first direction.

4. The substrate member of claim 2 wherein said contact pads occupy an array wherein some of said pads are substantially parallel and lie in a first direction and others of said pads are substantially parallel and lie in a second direction.

5. The substrate member of claim 4 wherein said second direction is substantially perpendicular to said first direction.

6. The substrate member according to claim 3 wherein said contact pads occupy a substantially staggered relationship with respect to each other.

* * * * *

UNITED STATES PATENT AND TRADEMARK OFFICE
CERTIFICATE OF CORRECTION

PATENT NO.   :   5,252,781
DATED        :   Oct. 12, 1993
INVENTOR(S)  :   Masaharu Shirai et al It is certified that error appears in the above-identified patent and that said Letters Patent is hereby corrected as shown below:

Column 7, line 42 (claim 1) replace "sand" with "said"

Column 8, line 1 (claim 1) replace "that" with "than"

Signed and Sealed this

Twelfth Day of April, 1994

Attest:

BRUCE LEHMAN

*Attesting Officer*    *Commissioner of Patents and Trademarks*